(12) United States Patent (10) Patent No.: US 8,698,565 B2
Obkircher et al. (45) Date of Patent: Apr. 15, 2014

(54) DYNAMIC VOLTAGE-CONTROLLED OSCILLATOR CALIBRATION AND SELECTION

(75) Inventors: Thomas Obkircher, Tustin, CA (US); Bipul Agarwal, Irvine, CA (US); Georgi Taskov, Santa Ana, CA (US)

(73) Assignee: Skyworks Solutions, Inc., Woburn, MA (US)

(*) Notice: Subject to any disclaimer, the term of this patent is extended or adjusted under 35 U.S.C. 154(b) by 116 days.

(21) Appl. No.: 12/802,282

(22) Filed: Jun. 2, 2010

(65) Prior Publication Data

US 2011/0298503 A1 Dec. 8, 2011

(51) Int. Cl.
*H03L 7/00* (2006.01)

(52) U.S. Cl.
USPC ............ 331/2; 331/1 R; 331/16; 331/34; 331/46; 331/49; 331/177 R; 331/179

(58) Field of Classification Search
USPC .......... 331/1 R, 2, 46, 49, 179, 16, 34, 177 R; 327/147
See application file for complete search history.

(56) References Cited

U.S. PATENT DOCUMENTS

| | | | | |
|---|---|---|---|---|
| 5,686,864 | A | * | 11/1997 | Martin et al. ............... 331/1 A |
| 6,064,947 | A | | 5/2000 | Sun et al. |
| 6,707,342 | B1 | * | 3/2004 | Zachan et al. .............. 331/2 |
| 7,061,288 | B2 | * | 6/2006 | Burgess ................... 327/156 |
| 7,155,188 | B2 | * | 12/2006 | Noboru et al. ............. 455/255 |
| 7,236,810 | B1 | | 6/2007 | Underbrink et al. |
| 7,548,120 | B2 | * | 6/2009 | Lam et al. ................. 331/2 |
| 7,589,592 | B2 | | 9/2009 | Fisher et al. |
| 7,647,028 | B2 | | 1/2010 | Beamish et al. |
| 7,706,760 | B2 | | 4/2010 | Rozenblit et al. |
| 2003/0224749 | A1 | | 12/2003 | Uozumi et al. |
| 2005/0179501 | A1 | | 8/2005 | Natonio et al. |
| 2005/0240370 | A1 | | 10/2005 | Diorio et al. |
| 2007/0021072 | A1 | | 1/2007 | Douglas |
| 2007/0159261 | A1 | | 7/2007 | Lee |
| 2009/0088113 | A1 | * | 4/2009 | Marsili et al. ............. 455/260 |
| 2010/0237954 | A1 | * | 9/2010 | Hall et al. ................. 331/44 |
| 2010/0283551 | A1 | * | 11/2010 | Zeng et al. ............ 331/117 FE |

FOREIGN PATENT DOCUMENTS

| | | |
|---|---|---|
| EP | 460 762 | 9/2004 |
| EP | 1 551 102 | 7/2005 |
| EP | 1 583 221 | 10/2005 |
| WO | 2003/077422 | 9/2003 |
| WO | 2007/055870 | 5/2007 |

\* cited by examiner

*Primary Examiner* — Arnold Kinkead
*Assistant Examiner* — Richard Tan
(74) *Attorney, Agent, or Firm* — Weide & Miller, Ltd.

(57) ABSTRACT

A method and apparatus is disclosed for voltage-controlled oscillator selection in a multi-mode system having multiple voltage-controlled oscillators. Part of oscillator selection is a calibration operation that utilizes maximum and minimum capacitance limits for a voltage-controlled oscillator, which translates to a frequency range, to calculate overlap regions. Overlap regions comprise frequency ranges that overlap such that the overlap region may be generated by two voltage-controlled oscillators with adjacent frequency ranges. One voltage-controlled oscillator selection routine comprises a real time voltage-controlled oscillator calibration and selection routine that executes every time the system requests a new frequency. Another selection routine comprises a start-up routine that executes only at power up or periodically. Another selection routine comprises a successive voltage-controlled oscillator routine that executes every time a frequency is requested by comparing a requested frequency to different frequency thresholds without executing a calibration operation.

29 Claims, 8 Drawing Sheets

FIG. 8

DYNAMIC VOLTAGE-CONTROLLED OSCILLATOR CALIBRATION AND SELECTION

FIELD OF THE INVENTION

The invention relates to voltage-controlled oscillators and in particular to a method and apparatus for voltage-controlled oscillator selection and calibration.

RELATED ART

Voltage-controlled oscillator (VCO) is a commonly utilized electronic arrangement whereby a control voltage determines an oscillation rate. By adjusting the control voltage, one or more aspects of oscillator are modified, which in turn changes the frequency of the output signal from the VCO.

Modern electronic devices and communication devices in particular are enabled for operation in multiple frequency bands, which is often referred to a multi-mode device. To facilitate operation in multiple frequency bands, a wideband frequency synthesizer is designed to support a wide range of output frequencies. For example, the frequency output range may be from 2.5 to 5.5 GHz. As can be appreciated, this is a wide frequency range and as a drawback to the prior art, a single VCO would be unable to generate this wide-band output while maintaining specified performance levels, such as a minimum output amplitude and phase noise. Alternatively, a wideband VCO may be desirable because a single item can be manufactured which is capable of use in different devices, where those different devices operate in different frequency bands. Hence, a different frequency synthesizer would not have to be designed and manufactured for each device.

To overcome the drawback in the single VCO prior art, some prior art designs implement two or more VCOs within a single device. In such an arrangement, each VCO is dedicated to a specific frequency band and the frequency band of those VCOs may overlap. The overlap region is a frequency range that falls within the operating range of two different VCOs, typically at the upper frequency range of one VCO and the lower frequency range of a second VCO.

In such an arrangement, a particular VCO is selected based on a requested output frequency of the device that may be tracked or established by a digital frequency centering (DFC) tuning routine. Prior art VCO selection routines performed adequately when a requested frequency was not in an overlap region, but suffer from drawbacks when the output frequency is within a frequency overlap region between two VCOs. The problem with operating within the overlap region is that due to supply voltage, manufacturing process, and temperature variation between VCOs, the selected VCO may actually be operating at a frequency that is beyond its ideal range, which in turn leads to lower performance and failure to meet specification requirements. For example, phase noise may increase to unacceptable levels.

One proposed solution to this problem as it results from process variation is to design and execute a factory calibration process on each individual synthesizer to identify the acceptable frequency output range for each VCO. From this acceptable frequency output range, the best VCO may be selected during operation. Although this solution overcomes some of the drawbacks in the prior art, this solution increases cost and production time, and therefore may not be cost effective. In addition, this solution may not address the changes in synthesizer performance in response to temperature and supply voltage variation that occur within the VCOs during use in the field.

One approach to compensate for changes in VCO-based synthesizer operation that results from changes in temperature is to utilize on-chip or off-chip temperature sensors and temperature-dependent VCO selection processing routines. A temperature sensor is typically a separate element that monitors the temperature of the VCO. Based on the reported temperature, a control routine adjusts either operation of the electronic system containing the VCO or operation of the VCO itself to account for estimated changes in synthesizer operation with temperature. However, these sensors and the control routine may undesirably increase cost, complexity, and the size of the product.

SUMMARY

To overcome the drawbacks in the prior art and provide additional benefits, a dynamic voltage-controlled oscillator (VCO) calibration and selection method is disclosed. In general, in a system with multiple VCOs, a maximum and minimum capacitance value is set for each VCO. From these capacitance values, one or more frequency thresholds are calculated. The frequency thresholds are used during the VCO selection process such that a requested frequency is compared to one or more frequency thresholds to select which of the multiple VCOs is designated the active VCO.

Disclosed herein is a method for selecting an active voltage-controlled oscillator from two or more voltage-controlled oscillators. This method comprises receiving a request for a signal at a particular frequency, referred to as the requested frequency. At the time of execution or prior to execution of this selection method, a minimum and maximum capacitance value for at least one voltage-controlled oscillator is set. Processing occurs to translate these capacitance values a frequency threshold for at least one voltage-controlled oscillator. Then, the method compares the frequency request to the frequency threshold to determine if the frequency request is greater than or less than the frequency threshold. Responsive to the comparing, the method selects one of the two or more voltage-controlled oscillators to be the active voltage-controlled oscillator and then generates the signal at the requested frequency using the active voltage-controlled oscillator.

Other systems, methods, features and advantages of the invention will be or will become apparent to one of ordinary skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawbacks in the prior art and provide additional advantages, various methods and apparatus for VCO selection are disclosed. By establishing and enacting the selection routines disclosed herein, the VCO selection may occur more accurately than in the prior art and preferably without variation in manufacturing processing causing sub-optimal performance.

Figure 1:
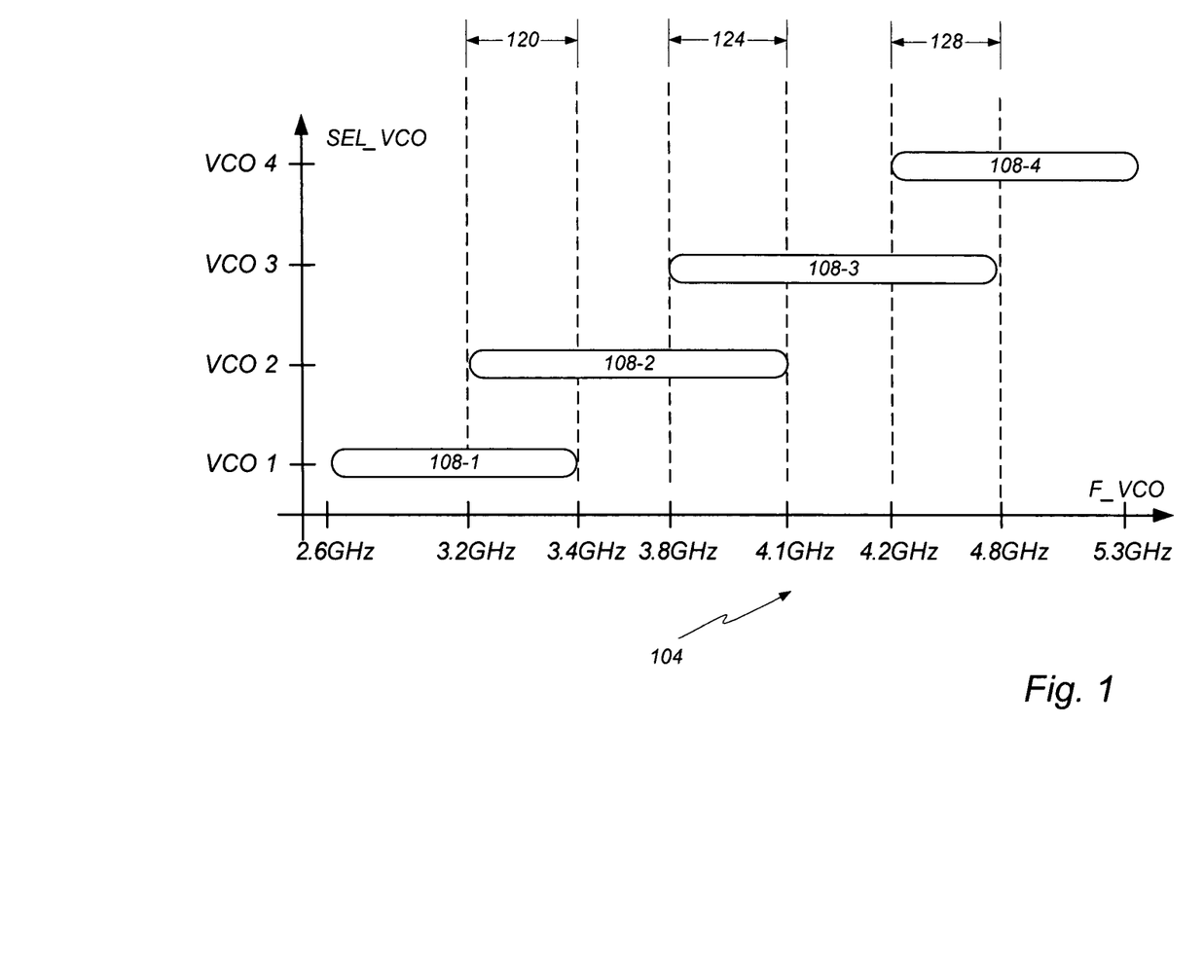
FIG. 1 is an exemplary plot showing voltage-controlled oscillator (VCO) frequency overlap.

FIG. 1 illustrates an exemplary plot of the potential frequency ranges and overlap for multiple VCO. While this exemplary plot provides exemplary frequency ranges and overlap ranges, these ranges are provided for purposes of discussion only and the claims that follow are not limited by these numeric ranges. In addition, although the discussion that follows references four VCOs, it is contemplated that any number of VCOs maybe implemented in a system.

As shown in FIG. 1, each VCO1 through VCO4 is shown in the vertical axis while frequency is shown on the horizontal axis 104. For each VCO, a coverage range 108-1 through 108-4 represents the range of frequencies, referenced on the horizontal axis, which can potentially be output by the VCO. As set forth above, the VCO may be unable to perform within specification over the entire frequency range. The term specification is defined as the technical operational requirements for the VCO, the synthesizer, or an electronic system. If the VCO or synthesizer does not operate within specification, the electronic system with which the VCO or synthesizer is associated may not operate properly.

Overlap exists between the frequency range of each VCO such that a portion of the frequency range covered by VCO1 overlaps with a portion of the frequency range covered by VCO2. This section of overlap is shown as overlap 120. Overlap region 124 is the overlap between the frequency range of VCO2 and the frequency range of VCO3. Overlap 128 is the overlap region between the frequency range of VCO3 and the frequency range of VCO4. Depending on the frequency, a different VCO is selected, but in the overlap regions, challenges arise regarding which VCO to select.

Disclosed herein are various routines and selection processes that dynamically execute as part of a frequency synthesizer operation to improve performance by improving VCO selection. These various routines may execute at different times depending on how the system is configured and the system specifications. Each routine is discussed below individually, but it is contemplated that these various routines may be enabled alone or together in any combination. These routines are described below after a discussion of FIG. 2, which illustrates an exemplary block diagram of a radio frequency integrated circuit (RFIC) in a wireless communication device which may implement these exemplary methods.

Figure 2:
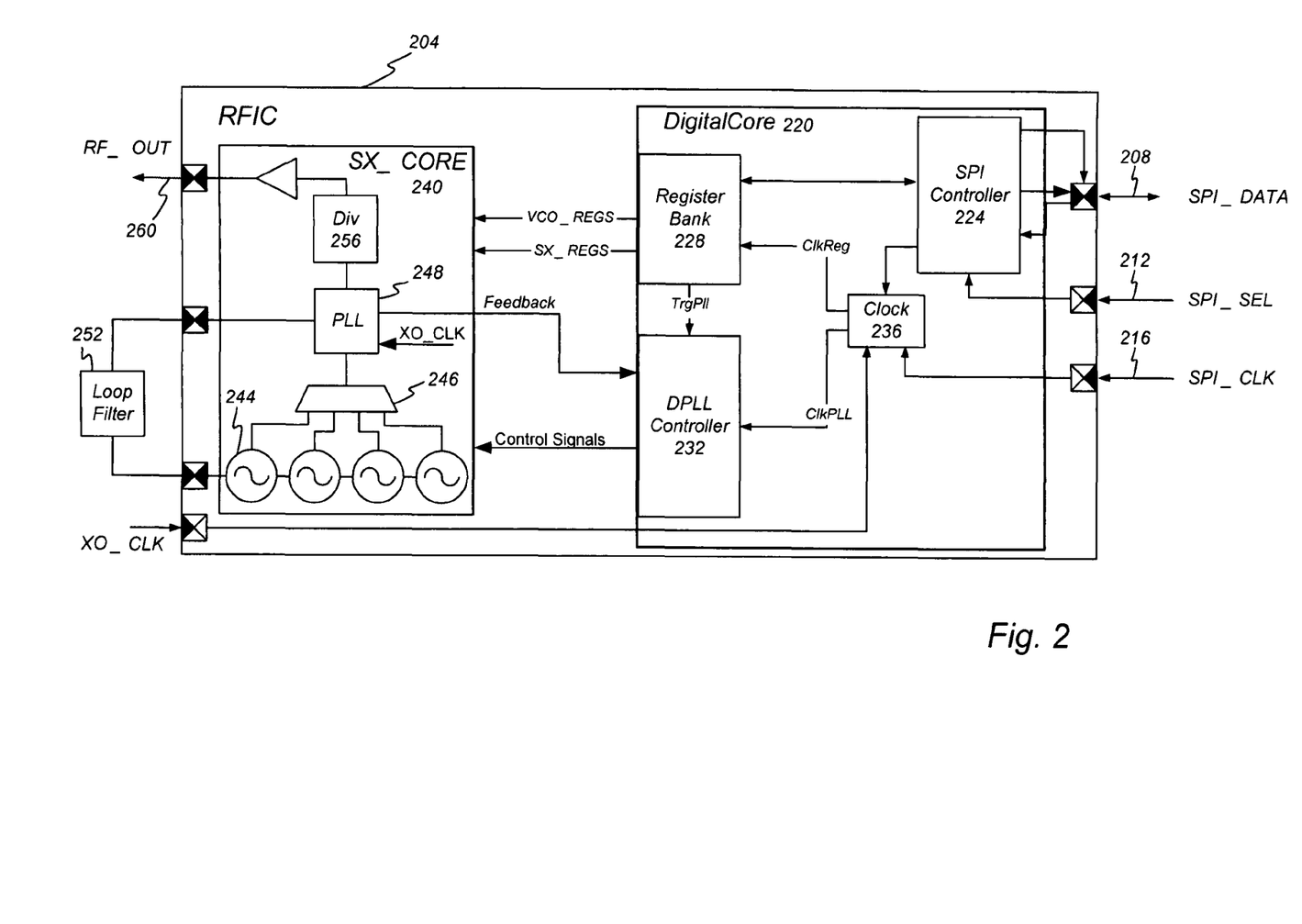
FIG. 2 is a block diagram illustrating an example embodiment of a radio frequency integrated circuit with multiple VCOs

A frequency synthesizer is shown in FIG. 2. In this embodiment, a radio frequency integrated circuit (RFIC) 204 receives several inputs comprising the SPI (serial peripheral interface) data 208, the SPI select 212, and the SPI clock 216, which are input to the digital core 220. The SPI select signal comprises a signal that enables the serial data transfer and latches the serial data stream into a control register upon its rising edge.

Figure 3:
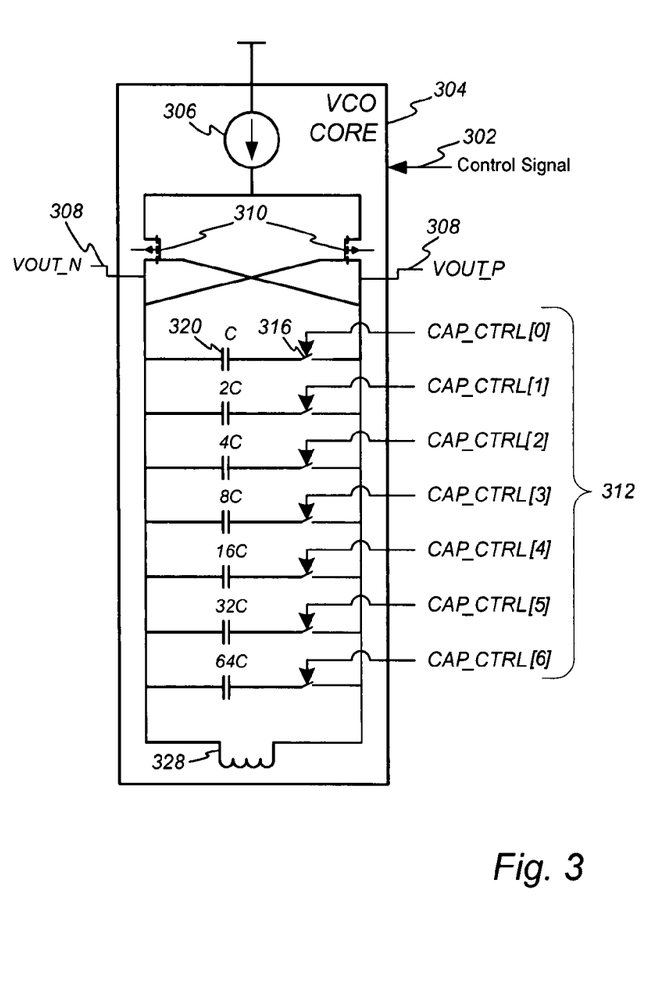
FIG. 3 illustrates an exemplary VCO core having a capacitor bank.

The digital core 220 comprises an SPI controller 224, a register bank 228, and a digital phase-locked loop (DPLL) controller 232. A clock 236 is also part of the digital core 220. The SPI controller 224 performs the serial-to-parallel data conversion from the serial input data to a control address data word and provides input to the register bank 228. The register bank 228 is configured to store one or more values that are generated by the calibration routine and utilized during the VCO selection routines. The DPLL controller 232 receives input from the register bank 228 and the clock 236 and exchanges data with a synthesizer core (SX_CORE) 240 via one or more connections as shown. The DPLL controller 232 provides control signals to the synthesizer core 240 as shown. The controllers 224, 232 may comprise a processor, DSP, state machines, logic, or any other type hardware. The controllers 224, 232 may be configured to execute software code configured to perform the operation described herein. In this embodiment, the DPLL controller 232 sends control signals the synthesizer core 240 to control switches (shown in FIG. 3) associated with voltage-controlled oscillators 244 to set a capacitance value of a capacitor bank that is associated with each voltage-controlled oscillator. As shown in FIG. 3 and discussed in more detail below, control signals from the DPLL control 232 to the synthesizer core 240 comprise CAP_CTRL signals 312.

The synthesizer core 240 presents a feedback signal to the DPLL controller 232. The feedback signal may provide information to the DPLL controller 232 regarding the signal and/or frequency generated by the synthesizer core 240 or any other type information. In one embodiment, the actual VCO output frequency, provided by the feedback signal, is compared to the requested frequency by the controller 232. Well-known techniques for measuring the actual VCO output frequency may be employed by the controller 232, such as a frequency counter referenced to the system clock or another frequency reference.

The synthesizer core 240 is now described. Based on input from the digital core 220, the synthesizer core 240 selects a particular VCO 244 from the four VCO cores shown. A multiplexer 246 selectively couples one of the outputs of the VCOs 244 to a phase-locked loop 248, which provides the phase-locked loop output to the loop filters 252, DPLL controller 232, and to a divider 256. The filters 252 may be realized off chip. Thereafter the RF signal is presented on output 260.

The calibration and selection routine executes in the controller 232 to determine overlap regions and threshold frequencies for switching between or selecting VCO cores 244. Then, during operation, the controller 232 controls, based on the desired frequency band, which VCO 244 to select to achieve desired performance. The requested frequency may be established by a base station, the user, the band or mode of operation, any other system or components, or set at the time of manufacture.

FIG. 3 illustrates an exemplary VCO core 304 having a capacitor bank. In relation to FIG. 2, the core 304 of FIG. 3 represents a component of the voltage-controlled oscillator 244. A control signal 302 from the loop filter 252 (FIG. 2) presents a control voltage to a varactor (not shown) associated with or part of the VCO core 304 shown in FIG. 3. The varactor is a known device that acts as a voltage controlled capacitor and performs fine-tuning of the VCO oscillation frequency. While the varactor performs real time fine-tuning, the capacitance generated by a bank of capacitors 320 is primarily responsible for determining the frequency of the signal output from the VCO. Therefore, by adjusting capacitance of the capacitor bank, the VCO output frequency is likewise adjusted.

In reference to FIG. 3, a VCO core 304 includes a power source 306 connected to cross-coupled FETs 310, which include outputs 308 that present output signals Vout_N and Vout_P. The devices 310 also connect to the capacitors 320 and an inductor 328 as shown. Each of the capacitors 320 may be connected in parallel with each other through a switch 316. The switches 316 receive CAP_CTRL signals 312 from a controller or other device. Any number of capacitors and associated switches may be utilized and although seven capacitors are shown in this embodiment, it is contemplated that any number may be utilized. Each capacitor may have the same capacitance value or, as shown, a different capacitance value to establish a greater range of potential capacitance. In this embodiment, the capacitances are binary-weighted and comprise C, 2C, 4C, 8C, 16C, 32C and 64C, where C represents the minimum amount of capacitance provided by the capacitors 320. Therefore, to establish a capacitance of 12C, capacitor CAP_CTRL signals 312 would close the switches for the 4C and 8C capacitors. Alternatively, capacitors with different weightings may be used.

Connecting and disconnecting the capacitors 320 by switches 316 establishes a capacitance for the VCO and determines the frequency of the signal output from the VCO. The processes of connecting the capacitors using the switches to establish the requested frequency with the VCO is referred to herein as digital frequency centering (DFC). The DFC operation occurs when the system receives a request for a signal at a requested frequency. In one embodiment the DPLL controller 232 (FIG. 2) executes the DFC routine in response to a frequency request. The controller 232 generates the CAP_CTRL signals 312 which are provided to the VCO core 304 to open and close the switches 316. This in turn establishes a capacitance that will force the VCO to generate and output the requested frequency. There is a feedback mechanism that provides feedback from the synthesizer core 240 to the DPLL controller 232 as shown in FIG. 2. The VCO provides feedback to the controller 232 in the form of the frequency generated by the VCO. The controller 232 compares the feedback signal, which indicates the frequency generated by the VCO, to the requested frequency to determine if the VCO is outputting the requested frequency. The controller 232 can adjust the capacitance of the VCO, by manipulating the switches 316 in the VCO, to increase or decrease the frequency output by the VCO so that it matches the requested frequency.

The DFC routine can also occur such that the controller 232 forces all of the switched open, and the resulting frequency generated by a particular VCO may be recorded. Likewise, the controller may force all of the switches closed, and the resulting frequency generated by the particular VCO may be recorded. Over time or as temperature or other parameters change, the frequencies generated when all the switches are closed or open will change.

It is possible to detect the capacitance or status of the bank by monitoring the CAP_CTRL signals 312, because these signals reveal which switches 316 are closed and open. Other methods and apparatus are contemplated for monitoring the capacitance of capacitor bank within the VCO core 304. For example, it may be possible to detect the capacitance of the capacitor bank by detecting the capacitance of the bank itself.

Figure 4:
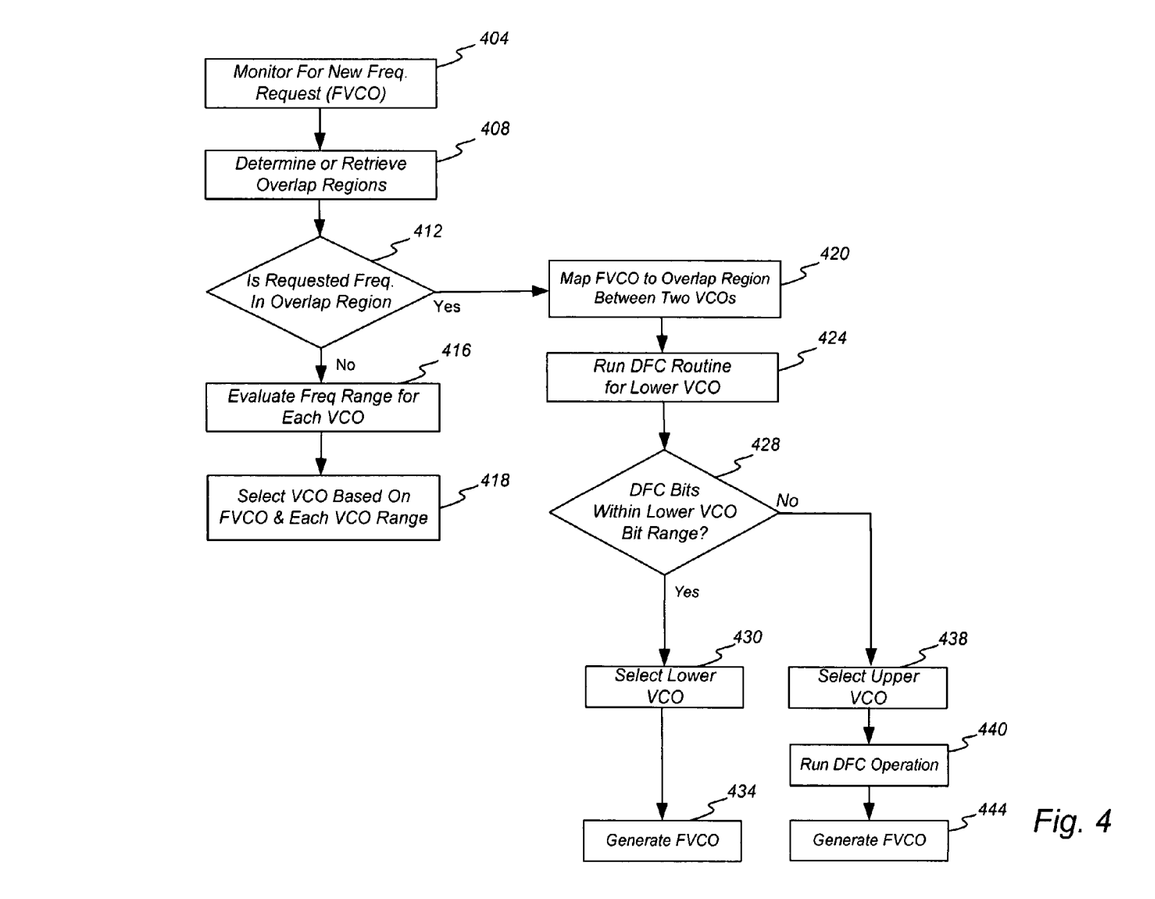
FIG. 4 illustrates an example flow diagram of an example method of real time VCO selection.

In operation, the apparatus described above may operate in various different routines to perform calibration and VCO selection. Described below are three exemplary method of operation. In generally, the methods of operation may be described as 1) real time VCO selection and calibration, 2) start-up VCO selection and calibration, and 3) successive VCO selection and calibration. Although separately described below, it is contemplated that these routines may be enabled or claimed alone or in any combination or sub-combination Real Time VCO Selection In this exemplary real time selection routine, the VCO selection occur dynamically and in real-time every time a new frequency is requested. FIG. 4 illustrates an example flow diagram of an example method of real-time VCO selection for two or more VCOs. In this example method of operation, at a step 404 a controller (e.g., controller 232 in FIG. 2) monitors for a new frequency request, such as from a user or a higher-level system. Upon receipt of such a request, the operation advances to a step 408. At step 408 the system determines or retrieves from memory or other location the overlap regions (e.g., 120, 124, and 128 in FIG. 1). In one embodiment the overlap regions, which may comprise frequency ranges, are stored in memory and retrieved at start-up or when a new frequency is requested. These overlap regions define the frequency range which may be generated by two different VCOs with overlapping frequency synthesis capability. For example, a first VCO may synthesize a lower frequency range while a second VCO may synthesize an upper frequency range. A portion of the frequency range of each VCO overlaps with the VCO. This overlap is referred to herein as the overlap region. In this example embodiment, VCO selection in response to a requested frequency which is in an overlap region is handled different then a requested frequency which is not in an overlap region.

In another embodiment the overlap regions are calculated by the system. This may occur by running the DFC routine for each VCO and then calculating the range of frequencies, i.e. the overlap region, which may be generated by two VCOs. This would occur as described above by establishing a maximum and minimum capacitance within one VCO, by switch manipulation, and recording the resulting synthesized frequency. This would occur for each VCO. The overlap regions could then be calculated.

After the overlap regions (frequency ranges) are identified, the operation advances to a decision step 412. At decision step 412 the operation determines if the requested frequency (FVCO) is in an overlap region. If the requested frequency is not in an overlap frequency then the operation advances to step 416. At step 416 the operation evaluates the frequency range for each VCO. This occurs to determine the frequency range which may be generated by each VCO and then, at a step 418, the operation selects the VCO which can generate the requested frequency based on each VCO's output range.

Alternatively, if at step 412 the operation determines that the requested frequency FVCO is within an overlap range, then the operation advances to step 420. At step 420, the operation maps the requested frequency FVCO to an overlap region between two VCOs.

At a step 424 the operation runs a digital frequency centering (DFC) routine, described above, for the lower-frequency range VCO. The lower-frequency range VCO is the VCO which synthesizes the lower-frequency range of the two VCOs having overlapping frequency ranges. Executing the DFC routine forces the VCO to synthesize the requested frequency, which occurs by the switch bank, according to the switch control signals, to establish a capacitance that will force the VCO to output the requested frequency. These switch control signals correlate to the capacitance of the capacitor bank in the VCO. These switch control signal may also be referred to as DFC bit values both of which correlate to capacitance. In one embodiment the DFC bit values are the same as or correlate to the CAP_CNTR 312 signals (FIG. 3) and are used herein interchangeably. As set forth herein, for desired operation the DFC bit values are preferably within an acceptable range which is a subset of the total DFC bit value range. For example, the acceptable range may be between 10% and 90% of the total DFC bit value range. In other embodiment the acceptable range may comprise other values.

At a decision step 428 the operation determines if the DFC bit values, which correlate to the capacitance of the capacitor bank, are within an acceptable range. If the DFC bit values are within an acceptable bit range bit range for the lower-frequency range VCO, then the operation advances to step 430. As a result, at step 430 the system selects the lower-frequency range VCO as the active VCO and then at step 434 the system generates the requested frequency FVCO using this lower-frequency range VCO.

If at decision step 428 the DFC bit values are not within the acceptable range for the lower-frequency range VCO, then the operation advances to step 438. At step 438 the system selects the upper-frequency range VCO and then at step 440 again runs the DFC operation to set the proper capacitance for the upper VCO. Then at step 440 as part of this DFC operation, the selected upper-frequency range VCO generates the requested frequency FVCO.

Start-Up VCO Selection

Figure 5:
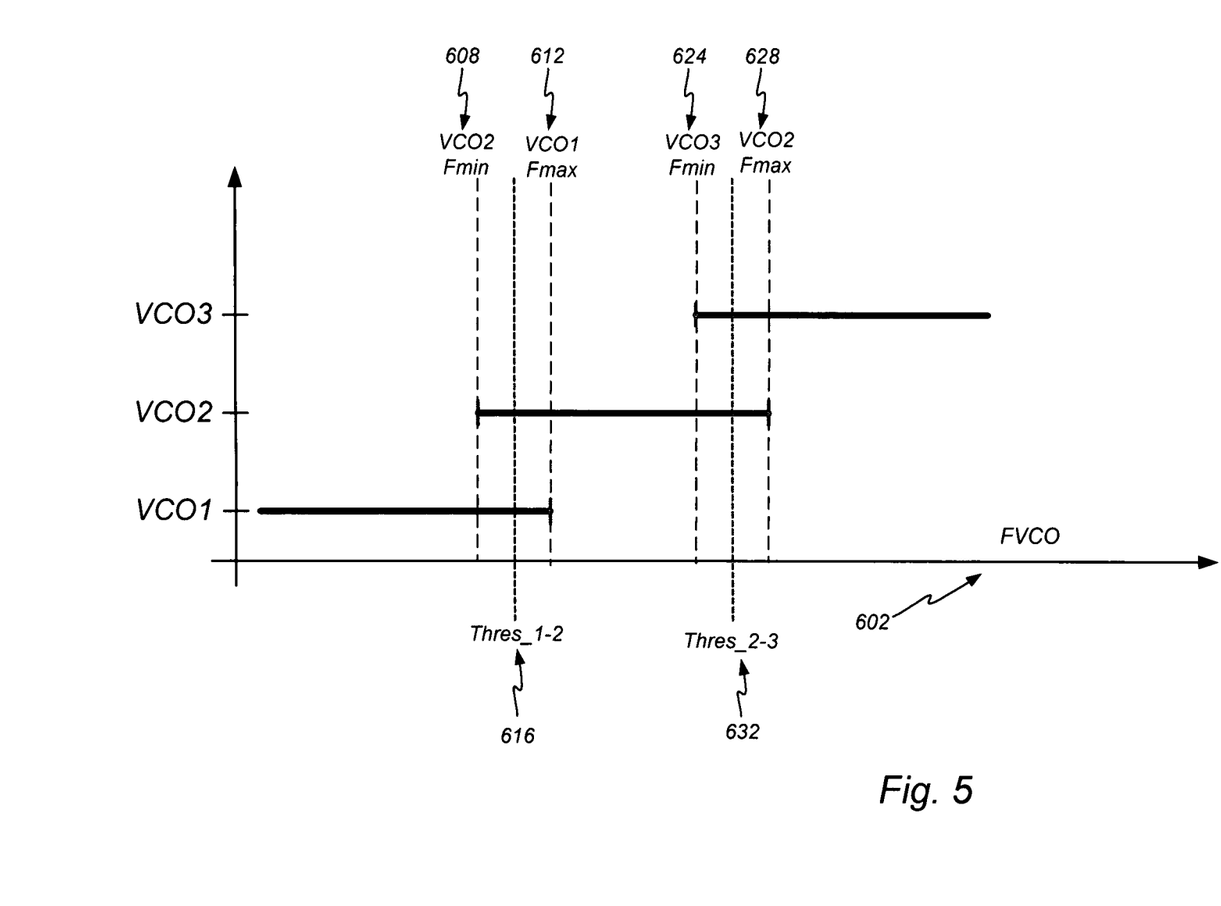
FIG. 5 illustrates an exemplary plot of frequency ranges for three exemplary VCO and minimum, maximum, and threshold frequencies for the VCO.

FIG. 5 illustrates an exemplary plot of frequency ranges for three exemplary VCOs including minimum, maximum, and threshold frequencies for the VCOs. This figure is provided to aid in the discussion of the innovation and should not be considered to limit the disclosure or claims that follow. As shown, the VCO is shown in the vertical axis that lists VCO1, VCO2, and VCO3. The horizontal axis 602 represents the FVCO, which is the requested frequency. Depending on the frequency requested by the user or other systems within the device, a different VCO will be selected.

Each VCO is designed to output a signal within a range of frequencies. Moving up in frequency for VCO1, a VCO2 minimum frequency 608 is established for VCO2. This is the minimum frequency that can be generated by VCO2, but the output signal from VCO2 at or near the VCO2 minimum frequency maybe out of specification.

The maximum frequency output from VCO1 is defined as VCO1 frequency maximum 612, which is the maximum possible frequency that VCO1 can generate, but the output signals from VCO1 at or near the VCO1 maximum frequency maybe out of specification. Between VCO2 frequency minimum 608 and the VCO1 frequency maximum 612 is a threshold frequency 616 from VCO1 to VCO2. This is defined as Thres_1-2 616. This frequency is the frequency at which the system will transition between VCO1 and VCO2. Requested frequencies greater than Thres_1-2 are generated by VCO2, while frequencies less than Thres_1-2 are generated by VCO1.

Located to the right along the horizontal axis 602 is the minimum frequency 624 for VCO3. This VCO3 minimum frequency is the minimum frequency that can be generated by VCO3, but output signals from VCO3 at or near this frequency may be out of specification. The VCO2 maximum frequency 628 defines the maximum frequency at which VCO2 may generate a signal, but such signal may be out of specification. Between the VCO3 minimum frequency 624 and the VCO2 maximum frequency is a threshold frequency 632. This threshold frequency 632 (Thres_2-3) is defined as the frequency at which the system will select either VCO2 or VCO3. Signals at frequencies greater than Thres_2-3 are generated by VCO3.

Figure 6:
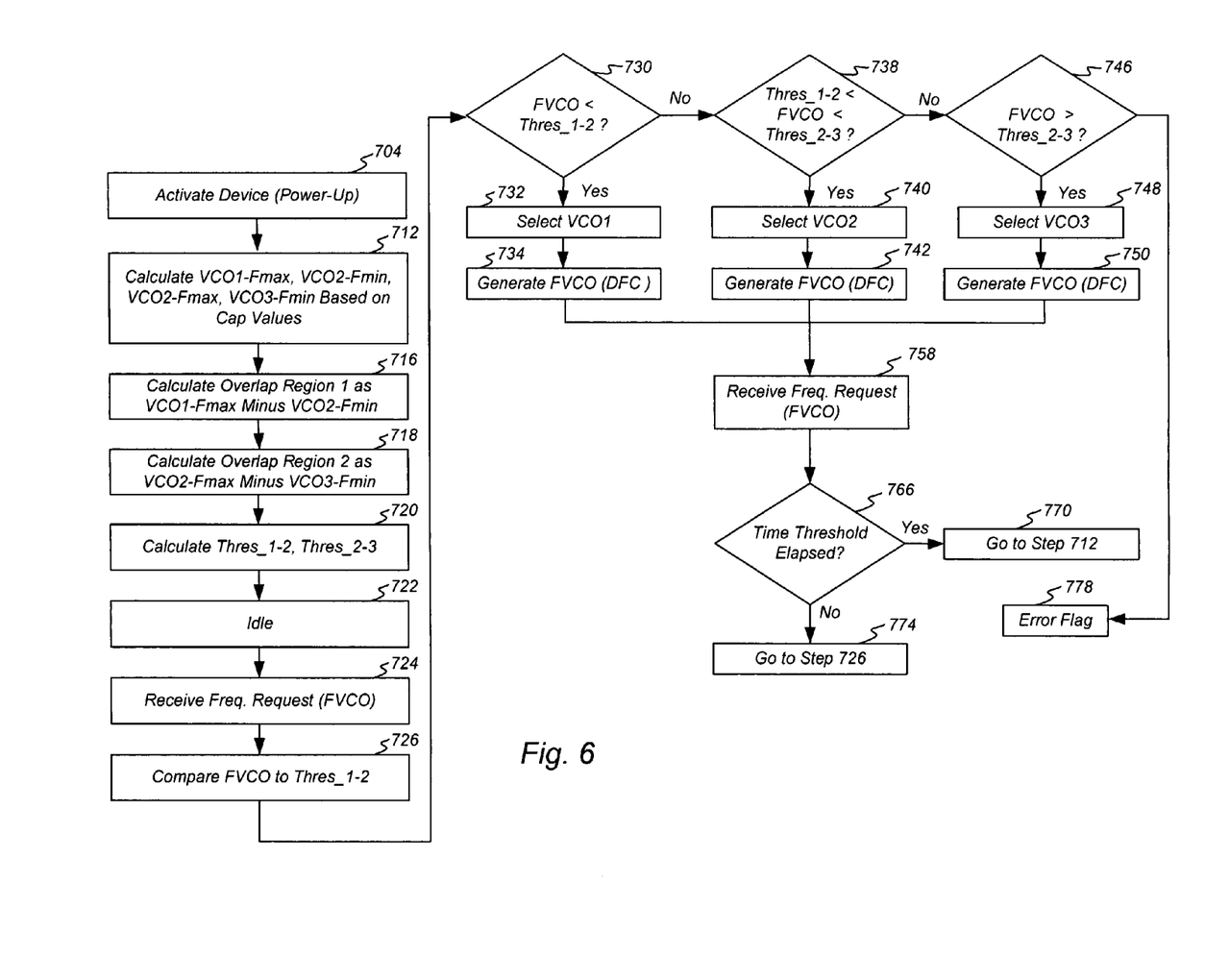
FIG. 6 illustrates an exemplary flow diagram of an example method of start-up VCO selection.

Working from this framework of VCO frequency ranges and definitions, FIG. 6 illustrates an exemplary flow diagram of an example method of start-up VCO selection. This is but one exemplary method for start-up VCO selection. In general, this operation performs a VCO selection routine at start-up or power-up of the device and this routine may optionally re-occur periodically during use or operation. Although FIG. 6 is shown in relation to a system with three VCOs, it is contemplated this method and the other methods of operation discussed herein may be applied to a system having any number of VCOs.

At a step 704, the synthesizer is activated or energized, such as powered-up by another system in the electronic device or a user. At a step 712, the controller measures, as described above, VCO1-Fmax, VCO2-Fmin, VCO2-Fmax, and VCO3-Fmin based on the maximum and minimum capacitance values in the capacitor bank 320 for each VCO 302 (FIG. 3). For example, for VCO1 the controller sends switch control signals to the VCO core for VCO1 to establish a maximum capacitance for VCO1. The resulting generated frequency is detected and stored in memory for VCO1. This frequency is the VCO1-Fmax because it is the maximum frequency that may be generated by VCO1. Similar operations occur for each VCO.

Then at a step 716, the system may optionally calculate the first overlap region as VCO1-Fmax minus VCO2-Fmin. The resulting range of frequencies in the first overlap region comprises the overlap in potential operational frequencies between VCO1 and VCO2. Similarly, at a step 718, the system may optionally calculate the second overlap region as VCO2-Fmax minus VCO3-Fmin. The resulting range of frequencies in the second overlap region comprises the overlap in the potential operational frequencies between VCO2 and VCO3. The first overlap region and the second overlap region may be stored in memory for use in subsequent processing. The VCOs are designed and selected to have an overlap in frequency range. This overlap may be considered an error margin so that even if manufacturing process variation occurs or a change in device parameter (aging, temperature or voltage) occurs, the VCOs generating adjacent frequency ranges will maintain an overlap region. When manufacturing process variation or changes in device parameter occur, these overlap regions may shift up or down in frequency.

At a step 720, the system calculates Thres_1-2 and Thres_2-3. As set forth in FIG. 6 and the associated discussion, these frequency thresholds are the frequency at which a different VCO is selected. In one embodiment, Thres_1-2 comprises the middle frequency in the first overlap region and Thres_2-3 comprises the middle frequency in the second overlap region. In another embodiment, the threshold frequency between two VCOs may comprise a frequency other than the middle frequency as it is contemplated that the high frequency performance may differ from the low frequency performance of a particular VCO.

At a step 722 the operation enters an idle period and awaits a request for a frequency or at a step 724, initiates VCO operation by receiving a request for a signal at a requested frequency (FVCO). It is contemplated that although this routine may run at start up, the request for frequency may occur immediately, or later in time.

At a step 726, the operation compares FVCO to Thres_1-2. This comparison occurs to determine if the requested frequency (i.e. a signal at a particular frequency) is greater than the threshold frequency separating VCO1 and VCO2. At a decision step 730, if FVCO is lesser than Thres_1-2, then the operation advances to a step 732 and the system selects VCO1 as the active VCO and at step 734, generates the requested frequency by executing the DFC routine to switch in the required number of capacitors in the capacitor bank (e.g., via control signal CAP_CTRL) to generate the requested frequency. Because the requested frequency is less than the threshold frequency between VCO1 and VCO2, it is assured that VCO1 can supply the signal at the requested frequency and the supply signal will meet specification.

Alternative, if at decision step 730 the requested frequency FVCO is greater than Thres_1-2, then the operation advances to decision step 738. At decision step 738, the system compares the FVCO to Thres_1-2 and Thres_2-3. If the requested frequency FVCO is between these two threshold frequencies, then at a step 740 VCO2 is selected as the active VCO and at step 742 it generates a signal at the requested frequency by executing the DFC routine to switch the required number of capacitors in the capacitor bank. If at decision step 738 the FVCO is not between the first threshold and the second threshold, then the operation advances to step 746 and a comparison occurs to determine if FVCO is greater than Thres_2-3. If it is not, then an error flag is set at step 778. If at FVCO is greater than the threshold frequency between VCO2 and VCO3, then the system selects VCO3 as the active VCO, at step 748 and at step 750 the system generates a signal at the requested frequency (FVCO) by executing the DFC routine to switch the required number of capacitors in the capacitor bank. It is contemplated that more than or fewer than three VCO may be established in the system and as such, this method of operation can be adjusted to generate and process additional threshold comparisons.

Operation continues with the system generating FVCO. As part of operation and after steps 734, 742, 750, a request for a different frequency is received at step 758. Thereafter, at decision step a decision a step 766 the operation compares an elapsed time from a prior calibration to a time threshold. If sufficient time has elapsed, such as an amount of time equal to a time threshold, then the system may undergo a new calibration. If the elapsed time since the last calibration is greater than the time threshold, then the operation advances to step 770 and the operation returns to step 712. By undergoing a new VCO selection routine, the system can account for changes in conditions that may change the threshold frequencies to thereby dynamically maintain operation within specification. For example, over time the temperature of the environment or the device operation may change and as a result, repeating the VCO selection routine would improve performance.

For example, the DFC routine executes at a first time when the system is at a first temperature. This first time and first temperature is defined as parameters T1. For parameters T1, the maximum capacitance and minimum capacitance is established for a VCO and the resulting maximum frequency and minimum frequency is recorded. For VCO2, this would correspond to VCO2-$\text{Fmin}_{T1}$ and VCO2-$\text{Fmax}_{T1}$ for parameters T1.

Over time the system ages and this aging alters its performance. In addition, over time temperature change will alter the system performance. Therefore, a second time and a second temperature are defined by the parameters T2. For parameters T2, the maximum capacitance and minimum capacitance is established for a VCO and the resulting maximum frequency and minimum frequency is recorded. For VCO2, this would correspond to VCO2-$\text{Fmin}_{T2}$ and VCO2-$\text{Fmax}_{T2}$ for parameters T2. Due to the change in parameters between T1 and T2, the VCO2-$\text{Fmin}_{T1}$ does not equal VCO2-$\text{Fmin}_{T2}$ and VCO2-$\text{Fmax}_{T1}$ does not equal VCO2-$\text{Fmax}_{T2}$. The threshold values, which are calculated from the Fmin and Fmax values, will also change. As a result, running the DFC routine to establish the different Fmin and Fmax values for each VCO calibrates the synthesizer and controller to the parameters that exist when the DFC routine is run. If calibration to the new parameters did not occur, the threshold values would not be accurate for the new parameters. It is contemplated that the parameters may include factors other than or in addition to aging and temperature.

If the time threshold has not elapsed at decision step 766, then although the new requested frequency is in an overlap region, the system will maintain the existing calibration values and map the request frequency to a VCO using these existing threshold values. Therefore, at a step 774 the system returns to step 726 and operation continues as set forth above.

In one embodiment, for a system having four VCOs, there are six boundaries that are established. These may be defined as TUNE1_HI which is the minimum capacitance for VCO1. VCO2 has TUNE2_LO which the maximum capacitance for VCO2 and TUNE2_HI which is the minimum capacitance for VCO2. VCO3 has TUNE3_LO which the maximum capacitance for VCO3 and TUNE3_HI which is the minimum capacitance for VCO3. Finally, TUNE4_LO is the maximum capacitance for the fourth VCO, VCO4.

Working from these variables the thresholds frequencies can be computed. For example in this embodiment, the threshold between VCO1 and VCO2 is the average of TUNE1_HI and TUNE2_LO. The threshold between VCO2 and VCO3 is the average of TUNE2_HI and TUNE3_LO. The threshold between VCO3 and VCO4 is the average of TUNE3_HI and TUNE4_LO. Then, when a new output frequency is requested, the proper VCO may be selected using these thresholds.

Successive VCO Selection

The successive VCO selection and calibration routine executes with every request for a new frequency and in contrast to the routines listed above, actively calculates which VCO should be selected as the active VCO without pre-calculating every threshold between VCO transitions. This is an alternative routine to the routine shown in FIG. 6. As a result, this process is less complex and easier to implement. In general, this method may analyze the DFC output bits in comparison to one or more ranges. If the DFC output bit value is not within a first range, then the operation advances to the next VCO range until the optimal VCO is located and selected. This process repeats for every change in requested frequency. In one embodiment, assuming a 7 bit DFC output, the acceptable range for the DFC bit values may be between 8 and 120, or 6.25% to 93.75% of the total bit value range (1-128). Assuming a 10% frequency overlap between two adjacent voltage-controlled oscillators, the selection of 6% of VCO range an undesired operation range forces the threshold to be near the middle of the overlap region. As a result, there is continuous frequency coverage since the selected VCO has at least 6% margin, which is sufficient to account for temperature and control voltage variations.

Figure 7:
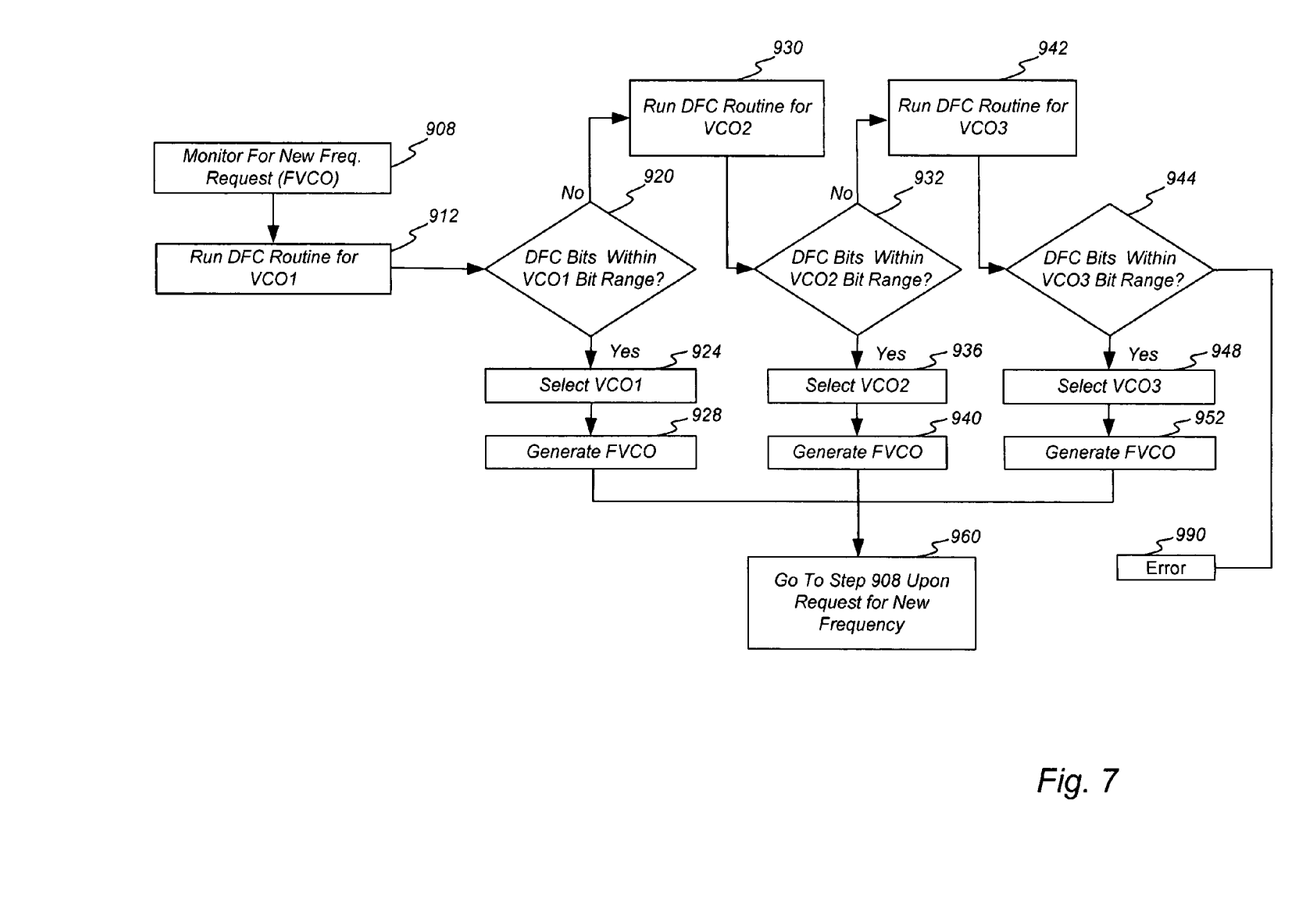
FIG. 7 illustrates an example embodiment of an exemplary method of successive VCO selection.

FIG. 7 illustrates a flow diagram of an exemplary method of successive VCO selection. This is but one possible example embodiment of a successive selection routine and as such it is contemplated that one of ordinary skill in the art may determine alternative routines which do not depart from the claims that follow. In addition, this exemplary embodiment performs the comparison based on the digital frequency centering (DFC) routine, which is relatable to the number of capacitors switched in the capacitor band and/or the actual capacitance. In this embodiment the DFC bit values are analyzed in relation to predetermine ranges to evaluate which VCO to utilize.

At a step 908 the operation monitors for a new frequency request for a requested frequency (FVCO). Next, at a step 912 the operation runs a DFC routine for VCO1. This operation determines the DFC bit values for the first VCO.

At a decision step 920 the operation determines if the actual or estimated DFC bit values are within the predetermined operating DFC bit range for VCO1. If the DFC bit values are within the VCO1 bit range, then the system selects the first VCO (VCO1) at a step 924 and at a step 928 generates the signal at the requested frequency (FVCO).

Alternatively, if at decision step 920, the DFC bit values are not within the acceptable bit range for VCO1, the operation moves to step 930 and the system runs a DFC routine for VCO2. This determines the DFC bit values for the second VCO.

Next, the operation advances to decision step 932. At decision step 932 the system compares the DFC bit values to the acceptable DFC bit range for VCO2. If the DFC bit values corresponding to the frequency of the requested signal fall within the range for the second VCO, then the operation advances to step 936, 940 and the system selects VCO2 as the active VCO and generates the FVCO.

If at decision step 932 the DFC bit values fall outside the acceptable bit range for VCO2, then the operation moves to step 942 and the system runs a DFC routine for VCO3. This determines the DFC bit values for the third VCO.

Next, the operation advances to a decision step 944 to verify that the DFC bit values fall within the acceptable DFC bit range for VCO3. If the DFC bit values doe not within an acceptable range then no VCO will be selected and the operation advances to step 990 and an error state is declared. If the DFC bit fall within an acceptable range, then the operation advances to steps 948 and 952 and the system selects VCO2 as the active VCO and generates the signal at the requested frequency (FVCO).

After steps 928, 940, and 952, the operation advances to a decision step 960 and the operation determines if there is a change in the requested frequency (FVCO). If at step 960 a new frequency is requested then the operation returns to step 908, which repeats the process. In systems with greater than three VCO this operation would continue until the proper VCO is selected.

Figure 8:
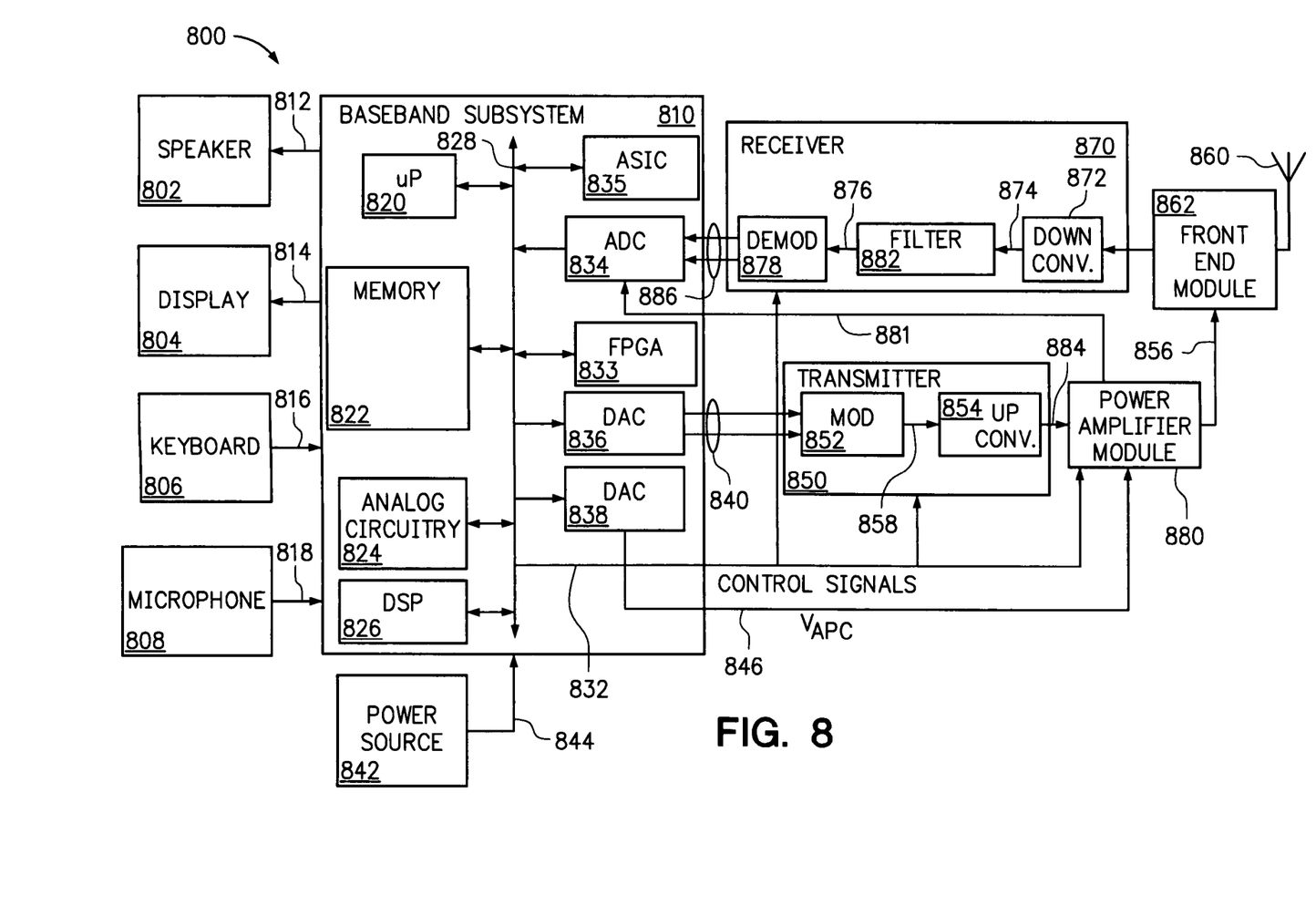
FIG. 8 illustrates an example environment of use comprising a portable transceiver.

FIG. 8 illustrates an example environment of use comprising an exemplary portable transceiver. This is one possible example environment of use of the innovation disclosed herein and as such, it is contemplated that the innovation may be used in many other environments. The portable transceiver 800 includes speaker 802, display 804, keyboard 806, and microphone 808, all connected to baseband subsystem 810. A power source 842, which may be a direct current (DC) battery or other power source, is also connected to the baseband subsystem 110 via connection 844 to provide power to the portable transceiver 800. In a particular embodiment, portable transceiver 800 can be, for example but not limited to, a portable telecommunication device such as a mobile cellular-type telephone. Speaker 802 and display 804 receive signals from baseband subsystem 810 via connections 812 and 814, respectively, as known to those skilled in the art. Similarly, keyboard 806 and microphone 808 supply signals to baseband subsystem 810 via connections 816 and 818, respectively. Baseband subsystem 810 includes microprocessor (.mu.P) 820, memory 822, analog circuitry 824, and digital signal processor (DSP) 826 in communication via bus 828. Bus 828, although shown as a single bus, may be implemented using multiple busses connected as necessary among the subsystems within baseband subsystem 810. The baseband subsystem 810 may also include an application specific integrated circuit (ASIC) 835 and a field programmable gate array FPGA) 833.

The microprocessor 820 and memory 822 provide the signal timing, processing and storage functions for portable transceiver 800. Analog circuitry 824 provides the analog processing functions for the signals within baseband subsystem 810. Baseband subsystem 810 provides control signals to transmitter 850, receiver 870 and the power amplifier module 880, such as through connection 832 for example.

The baseband subsystem 810 generates a power control signal, referred to herein as $V_{APC}$ that is supplied to the power amplifier module 880 via connection 846. The signal $V_{APC}$ is generated by the baseband subsystem 810 and is generally converted to an analog control signal by one of the digital-to-analog converters (DACs) 836 or 838 to be described below. The power control signal $V_{APC}$ may also be supplied from the bus 828 to indicate that the signal may be generated in different ways as known to those skilled in the art. Generally, the power control signal, $V_{APC}$, is generated in the baseband subsystem 810 and controls the output of the power amplifier as a function of the peak voltage of the power amplifier determined during calibration, and corresponds to power amplifier output power.

The control signals on connections 832 and 846 may originate from the DSP 826, the ASIC 835, the FPGA 833, from microprocessor 820, or may be generated on the transmitter 850, the receiver 870 or on a transceiver chip, on which the transmitter 850 and receiver 870 are located, and are supplied to a variety of connections within the transmitter 850, receiver 870 and the power amplifier module 880. It should be noted that, for simplicity, only the basic components of the portable transceiver 800 are illustrated herein. The control signals provided by the baseband subsystem 810 control the various components within the portable transceiver 800. Further, the function of the transmitter 850 and the receiver 870 may be integrated into a transceiver.

Baseband subsystem 810 also includes analog-to-digital converter (ADC) 834 and digital-to-analog converters (DACs) 836 and 838. Although DACs 836 and 838 are illustrated as two separate devices, it is understood that a single digital-to-analog converter may be used that performs the function of DACs 836 and 838. ADC 834, DAC 836 and DAC 838 also communicate with microprocessor 820, memory 822, analog circuitry 824 and DSP 826 via bus 828. DAC 836 converts the digital communication information within baseband subsystem 810 into an analog signal for transmission to a modulator 852 via connection 840. Connection 840, while shown as two directed arrows, includes the information that is to be transmitted by the transmitter 850 after conversion from the digital domain to the analog domain.

The transmitter 850 includes modulator 852, which modulates the analog information on connection 840 and provides a modulated signal via connection 858 to upconverter 854. The upconverter 854 transforms the modulated signal on connection 858 to an appropriate transmit frequency and provides the upconverted signal to the power amplifier module 880 via connection 884. The power amplifier module 880 contains one or more power amplifiers that amplify the signal to an appropriate power level for the system in which the portable transceiver 800 is designed to operate. Details of the structure and operation of the power amplifier module 880 are described below.

Details of the modulator 852 and the upconverter 854 have been omitted, as they will be understood by those skilled in the art. For example, the data on connection 840 is generally formatted by the baseband subsystem 110 into in-phase (I)

and quadrature (Q) components. The I and Q components may take different forms and be formatted differently depending upon the communication standard being employed. For example, when the power amplifier module is used in a constant-amplitude, phase (or frequency) modulation applications, such as the global system for mobile communications (GSM), the phase-modulated information is provided by the modulator 852. When the power amplifier module is used in an application requiring both phase and amplitude modulation such as, for example, extended data rates for GSM evolution, referred to as EDGE, the cartesian in-phase (I) and quadrature (Q) components of the transmit signal are converted to their polar counterparts, amplitude and phase. The phase-modulation is performed by the modulator 852, while the amplitude modulation is performed by elements of a power amplifier control element, where the amplitude envelope is defined by a power amplifier power control voltage $V_{APC}$, which is generated by the power amplifier control element. The instantaneous power level of the power amplifier module 880 tracks $V_{APC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier module 880 supplies the amplified signal via connection 856 to a front end module 862. The front end module 862 comprises an antenna system interface that may include, for example, a diplexer having a filter pair that allows simultaneous passage of both transmit signals and receive signals, as known to those having ordinary skill in the art. In an embodiment, the power amplifier module 880 and the front end module 862 may be combined into a single element. The transmit signal is supplied from the front end module 862 to the antenna 860.

A signal received by antenna 860 will be directed from the front-end module 862 to the receiver 870. The receiver 870 includes a downconverter 872, a filter 882, and a demodulator 878. If implemented using a direct conversion receiver (DCR), the downconverter 872 converts the received signal from an RF level to a baseband level (DC). Alternatively, the received RF signal may be downconverted to an intermediate frequency (IF) signal, depending on the application. The downconverted signal is sent to the filter 882 via connection 874. The filter comprises a least one filter stage to filter the received downconverted signal as known in the art.

The filtered signal is sent from the filter 882 via connection 876 to the demodulator 878. The demodulator 878 recovers the transmitted analog information and supplies a signal representing this information via connection 886 to the ADC 834. The ADC 934 converts these analog signals to a digital signal at baseband frequency and transfers the signal via bus 828 to DSP 826 for further processing.

The method and apparatus described herein would be utilized in the receiver 870 and the transmitter 850, with control signals generated by the baseband subsystem 810. The baseband subsystem 810, such as the ASCI 835 or other processing device, would provide control signals to the receiver 870 and the transmitter 850. In the receiver 870, the downconverter 872 utilizes the signals generated by the frequency synthesizer described and shown in FIG. 2 to down convert received signals to baseband. In the transmitter 850, the modulator 852 utilizes the signals generated by the frequency synthesizer described and shown in FIG. 2 to modulate a baseband signal to an RF signal suitable for transmission.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for selecting an active voltage-controlled oscillator from two or more voltage-controlled oscillators comprising:
    establishing a capacitance range, which may include a minimum capacitance and a maximum capacitance, for at least one of a first voltage-controlled oscillator and a second voltage controlled oscillator and recording either a minimum capacitor control value, a maximum capacitor control value, or both for each capacitance range;
    determining an overlap region between the first voltage-controlled oscillator and the second voltage controlled oscillator, the overlap defined by overlap capacitor control values corresponding to overlapping frequency range between two voltage controlled oscillators;
    receiving a request for a signal at a requested frequency;
    determining if the requested frequency is in the overlap region;
    if the requested frequency is not in the overlap region, selecting whether to generate the signal at the requested frequency with the first voltage controlled oscillator or the second voltage controlled oscillator and generating the signal at the requested frequency with a selected voltage controlled oscillator;
    if the requested frequency is in the overlap region, executing a digital frequency centering (DFC) routine, for either the first voltage controlled oscillator or the second voltage controlled oscillator, which generates DFC routine capacitor control values;
    determining if the DFC routine capacitor control values are within an predetermined accepted range for the voltage controlled oscillator on which the DFC routine executed;
    if the DFC routine capacitor control values are within a predetermined accepted range for the voltage controlled oscillator on which the DFC routine executed, then selecting the voltage controlled oscillator on which the DFC routine executed to generate the signal at the requested frequency; and
    if the DFC routine capacitor control values are not within the predetermined accepted range for the voltage controlled oscillator on which the DFC routine executed, then selecting another voltage controlled oscillator to generate the signal at the requested frequency.

2. The method of claim 1 further comprising a third voltage controlled oscillator and a forth voltage controlled oscillator and the establishing a capacitance range includes establishing at least one capacitor control value for each voltage-controlled oscillator.

3. The method of claim 1 wherein the establishing a capacitance range includes accessing a memory to obtain the capacitance range.

4. The method of claim 1 further including comparing a threshold frequency to the requested frequency to determine if the requested frequency is in the overlap region.

5. The method of claim 4 further comprising:
    receiving a second request for a second signal at a second frequency;
    determining if the second frequency is in the overlap region;
    if the second frequency is not in the overlap region, selecting whether to generate the second signal at the requested second frequency with the first voltage controlled oscillator or the second voltage controlled oscillator and generating the second signal at the requested second frequency with the selected voltage controlled oscillator;

if the second frequency is in the overlap region, executing a digital frequency centering (DFC) routine for either the first voltage controlled oscillator or the second voltage controlled oscillator to generate second DFC routine capacitor control values;

determining if the second DFC routine capacitor control values are within the predetermined accepted range for the voltage controlled oscillator on which the DFC routine executed; and if the second DFC routine capacitor control values are within the predetermined accepted range for the voltage controlled oscillator on which the DFC routine executed, then selecting the voltage controlled oscillator on which the DFC routine executed to generate the second signal at the requested second frequency.

6. A method for selecting a voltage-controlled oscillator from a set of two or more voltage-controlled oscillators comprising:

initiating a voltage-controlled oscillator selection routine by calculating capacitor control values based at least one minimum capacitance and at least one maximum capacitance for at least one voltage controlled oscillator or recalling from memory at least one capacitor control value for the voltage-controlled oscillator, and calculating at least one threshold frequency for the voltage-controlled oscillator, the threshold frequency related to the capacitor control values that were calculated or recalled from the memory and the threshold frequency defining an overlap region;

receiving a signal request for a requested frequency;

comparing the requested frequency to the at least one threshold frequency to determine if the requested frequency is in the overlap region;

if the requested frequency is not in the overlap region, then generating the requested frequency with a voltage-controlled oscillator selected based on capacitor control values determined during a calibration routine;

if the requested frequency is in the overlap region, then performing a digital frequency centering (DFC) routing to generate DFC bit values for the voltage-controlled oscillator;

comparing the generated DFC bit values to a predetermined range of DFC bit values for the voltage-controlled oscillator to determine if the generated DFC bit values are within a predetermined range of DFC bit values for the voltage-controlled oscillator;

if the generated DFC bit values are within the predetermined range of DFC bit values for the voltage-controlled oscillator, then generating the requested frequency with the voltage-controlled oscillator; and if the generated DFC bit values are not within the predetermined range of DFC bit values for the voltage-controlled oscillator, then generating the requested frequency with a second voltage-controlled oscillator.

7. The method of claim 6 wherein the voltage-controlled oscillator selection routine includes digital frequency centering only when the requested frequency is in the overlap region.

8. The method of claim 7 wherein the overlap region is based on 10% of a minimum capacitance and a maximum capacitance for a voltage-controlled oscillator.

9. The method of claim 6 wherein the at least one threshold frequency is a frequency that defines a boundary between two different voltage-controlled oscillators.

10. The method of claim 6 further including maintaining the same at least one threshold frequency until a communication device is powered down or a pre-determine period of time has elapsed.

11. The method of claim 9 wherein the at least one threshold frequency is a frequency which determines whether the voltage-controlled oscillator will transition to another voltage-controlled oscillator.

12. The method of claim 6 further including receiving a second signal request at a second requested frequency, comparing the second requested frequency to the at least one threshold frequency, and responsive to the comparing, activating a second voltage-controlled oscillator to generate a second signal at the second requested frequency without initiating the calibration routine.

13. The method of claim 6 wherein the method executes in a digital phase-locked loop controller.

14. A frequency synthesizer having a voltage-controlled oscillator selection routine comprising:

a synthesizer core including two or more voltage-controlled oscillators, at least one capacitor bank, and at least one switch bank connected to the at least one capacitor bank, the at least one switch bank being responsive to a control signal configured to selectively connect and disconnect the capacitors from a voltage-controlled oscillator to establish a capacitance;

a memory storing DFC bit ranges for the two or more voltage-controlled oscillators; and one or more controllers configured to:

monitor for a request for a new frequency;

responsive to a new frequency request, perform a digital frequency centering (DFC) routine for a first voltage-controlled oscillator to generate first voltage-controlled oscillator DFC bits;

comparing the first voltage-controlled oscillator DFC bits to a DFC bit range for the first voltage-controlled oscillator;

if the first voltage-controlled oscillator DFC bits are within the range of the DFC bit range for the first voltage-controlled oscillator then establishing the first voltage-controlled oscillator as an active voltage-controlled oscillator to generate the new frequency; and if the first voltage-controlled oscillator DFC bits are not within the range of the DFC bit range for the first voltage-controlled oscillator then repeating the DFC routing on a second voltage-controlled oscillator.

15. The frequency synthesizer of claim 14 wherein the controller is further configured to only perform the DFC routine if the new frequency is in an overlap region.

16. The frequency synthesizer of claim 15 wherein the controller includes a digital phase-locked loop controller.

17. The frequency synthesizer of claim 14 wherein the capacitance establishes the frequency output from a voltage-controlled oscillator.

18. The frequency synthesizer of claim 14 wherein the DFC bit range corresponds to a maximum frequency at which the at least one voltage-controlled oscillator may output a signal within specification and to a minimum frequency at which the at least one voltage-controlled oscillator may output a signal within specification.

19. The frequency synthesizer of claim 18 wherein each of the two or more voltage-controlled oscillators is capable of outputting a signal having a range of frequencies and each voltage-controlled oscillator has a frequency overlap region with another voltage-controlled oscillator.

20. A method for selecting an active voltage-controlled oscillator from two or more voltage-controlled oscillators comprising:
performing a digital frequency centering routine to create a stored capacitor bank control value range for two or more voltage-controlled oscillators;
processing the capacitor bank control value range for the two or more voltage-controlled oscillators to establish control value overlap regions;
receiving a request for a signal at a requested frequency;
attempting to generate the requested frequency with a first voltage-controlled oscillator by establishing a generated capacitance using a capacitor bank control value;
comparing the capacitor bank control value established when attempting to generate the requested frequency with the first voltage-controlled oscillator to determine if the established capacitor bank control value is within the capacitor bank control value range for the first voltage-controlled oscillator;
responsive to the comparing, if the established capacitor bank control value is within the capacitor bank control value range for the first voltage-controlled oscillator selecting the first voltage-controlled oscillator to be the active voltage-controlled oscillator;
responsive to the comparing, if the established capacitor bank control value is not within the capacitor bank control value range for the first voltage-controlled oscillator then comparing the established capacitor bank control value to a capacitor bank control value range for a second voltage-controlled oscillator; and
if the established capacitor bank control value is within a control value overlap region, then repeating the digital frequency centering routine if a time threshold has elapsed since a prior digital frequency centering routine was performed.

21. The method of claim 20 wherein establishing a capacitor bank control value range includes establishing a minimum capacitor bank control value, a maximum capacitor bank control value, or both for each voltage-controlled oscillator.

22. The method of claim 20 wherein establishing a capacitor bank control value range includes opening all switches in a switch bank and closing all switches in the switch bank, the switch bank part of at least one of the two or more voltage-controlled oscillators.

23. The method of claim 20 further comprising:
receiving a second request for a second signal at a second frequency;
translating the second frequency to a second capacitor bank control value;
comparing the second capacitor bank control value to a capacitor bank control value range for the active voltage-controlled oscillator to determine if the second capacitor bank control value is within the capacitor bank control value range for the active voltage-controlled oscillator; and
responsive to the comparing, either maintaining a same voltage-controlled oscillator as the active voltage-controlled oscillator or selecting another voltage-controlled oscillator to be the active voltage-controlled oscillator.

24. A method for selecting an active voltage-controlled oscillator from two or more voltage-controlled oscillators comprising:
executing a calibration routine to calculate an overlap region and a non-overlap region both of which are defined by one or more capacitor control values for each voltage-controlled oscillator, the capacitor control values corresponding to a range of frequencies at which the voltage-controlled oscillator is capable of operation at specification;
receiving a request for a signal at a requested frequency;
translating the requested frequency to a requested capacitor control value;
evaluating whether the requested frequency is in the overlap region;
if the requested frequency is not in an overlap frequency, comparing the requested frequency to a range of frequencies for each voltage-controlled oscillator and establishing a voltage-controlled oscillator as the active voltage-controlled oscillator based on the comparing; and
if the requested frequency is in the overlap frequency, executing a calibration routine to generate recalculated capacitor control values for at least one voltage-controlled oscillator and comparing the recalculated capacitor control values to the requested capacitor control value to determine which voltage-controlled oscillator to establish as the active voltage-controlled oscillator.

25. The method of claim 24 wherein generating recalculated capacitor control values only occur if an amount of time equal to or greater than a time threshold has passed since a prior recalibration routine has occurred.

26. The method of claim 24 wherein generating recalculated capacitor control values only occurs when the two or more voltage-controlled oscillators are powered up after being powered down.

27. The method of claim 24 wherein the capacitor control values include digital frequency centering routine bits.

28. The method of claim 24 wherein evaluating whether the requested frequency is in the overlap region includes comparing the one or more capacitor control values that define the overlap region to the requested capacitor control value.

29. The method of claim 24 wherein executing the calibration routine to generate recalculated capacitor control values includes executing a DFC routine to calculate a new overlap region.

* * * * *